United States Patent
Fung

(10) Patent No.: US 6,935,894 B2
(45) Date of Patent: Aug. 30, 2005

(54) ELECTRIC DEVICE WITH WATER RESISTANT HOUSING

(75) Inventor: Yiu Keung Fung, Hong Kong (HK)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/326,177

(22) Filed: Dec. 19, 2002

(65) Prior Publication Data

US 2003/0119359 A1 Jun. 26, 2003

(30) Foreign Application Priority Data

Dec. 20, 2001 (EP) .......................................... 01205052

(51) Int. Cl.⁷ .............................................. H05K 5/06
(52) U.S. Cl. ................. 439/606; 174/17 CT; 200/302.1
(58) Field of Search ............................ 174/52.1, 52.3, 174/17 CT; 439/606; 206/497, 811; 220/4.02; 200/302.1

(56) References Cited

U.S. PATENT DOCUMENTS

| | | | | |
|---|---|---|---|---|
| 2,639,344 A | * | 5/1953 | Rickmeyer | 200/302.1 |
| 3,042,288 A | * | 7/1962 | Carpenter, Sr. | 206/811 |
| 3,297,852 A | * | 1/1967 | Moksu et al. | 200/302.1 |
| 3,685,682 A | * | 8/1972 | Frey, III | 174/17 CT |
| 3,992,567 A | * | 11/1976 | Malia | 439/278 |
| 5,613,237 A | * | 3/1997 | Bent et al. | 220/4.02 |
| 5,880,401 A | * | 3/1999 | Leischner et al. | 174/17 CT |

FOREIGN PATENT DOCUMENTS

EP 0777407 A1 11/1996 ............ H05K/5/06

OTHER PUBLICATIONS

Research Disclosure Mar. 1998 / 199, No. 40724; "Insert Moulding of electronic circuits combined with Die Slide Injection".

* cited by examiner

*Primary Examiner*—Renee Luebke

(57) ABSTRACT

An electric device comprises a housing (1) with at least two housing parts (2, 3) and a seam (4) between the first two housing parts (2, 3) and an electric circuit (5, 6, 8) inside the housing (1). The housing (1) also comprises at least one molded, third housing part (10) sealing the seam (4). The third housing part (10) covers at least a surface portion (11, 12) of at least one of the first two housing parts (2, 3), adjacent the seam (4), thus compensating manufacturing tolerances between surfaces on opposite sides of the seam (4). A method of manufacturing a particular embodiment of the proposed device is also described.

14 Claims, 1 Drawing Sheet

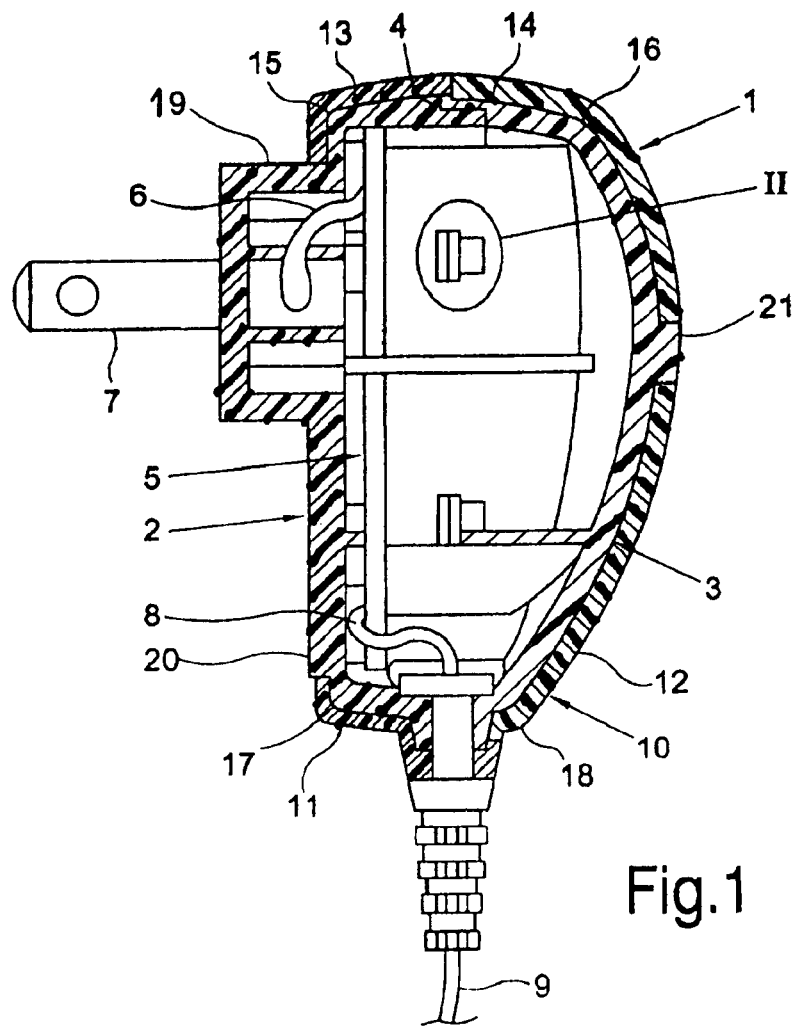
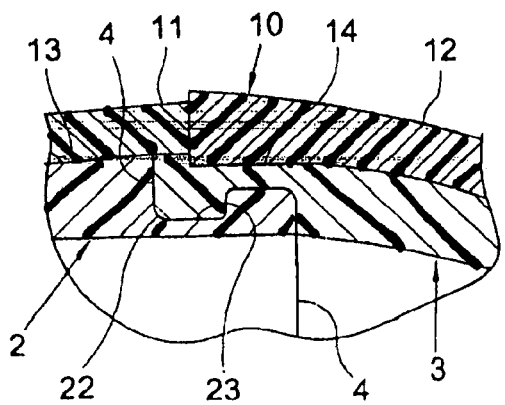

US 6,935,894 B2

ELECTRIC DEVICE WITH WATER RESISTANT HOUSING

BACKGROUND

The invention relates to an electric connector for connection to the mains. In this connector, a groove of a circumferential seam between the first and the second housing part is filled up by way of a circumferential molding. A device is known from Research Disclosure, March 1998/199 No. 40724.

SUMMARY

The invention relates to an electrical device and a method of manufacturing such a device. Apart from forming a seal, the circumferential molding contributes little to the function of the housing. Furthermore, the seam is quite narrow and prominently visible, so relatively small variations in the flushness between the outer surfaces of the first and the second parts have an adverse effect on the perceived quality of the device. For accurate control of such variations it is necessary to maintain relatively tight manufacturing tolerances on the two parts of the housing, which adds to manufacturing costs. For example, relatively a long cycle time may be needed to avoid warping of portions of the first and the second housing parts if these housing parts are injection molded. Furthermore, the need to provide a recess for the molding sealing the seam complicates the design of the two housing parts.

It is an object of the present invention to provide a solution to the problems associated with the application of molded parts to sealing seams between housing parts of electric devices.

According to the invention, this object is achieved by providing an electric device according to originally filed claim 1. Since surface portions of at least the first or the second housing part next to the seam are also covered, the molding sealing the seam also shields the seam from visibility and accommodates variations in the flushness between portions of the first and the second part on opposite sides of the seam. Furthermore, the need to provide a recess of substantial width for accommodating the molded seal is dispensed with, so that the two housing parts may be of a relatively simple design, thus reducing manufacturing costs.

The invention also provides a method that allows the manufacture of a device according to a particularly advantageous embodiment of the invention without having to feed material for the third part to sections of the mold forming surface portions of the product which will be prominently visible.

Particularly advantageous embodiments of the invention are set forth in the originally filed dependent claims.

DESCRIPTION OF THE DRAWINGS

The foregoing and other features and advantages of the present invention will become apparent to those skilled in the art to which the present invention relates upon consideration of the following detailed description of apparatus applying aspects of the present invention with reference to the accompanying drawings, wherein:

FIG. 1 is a cross-sectional side-elevation taken along a central plane, and

FIG. 2 is an enlarged cross-sectional view of a detail II in FIG. 1.

DESCRIPTION

The example of a device according to the invention shown in the drawings is a power plug for an electric device for use in humid conditions, such as a shaver which may be rechargeable and/or equipped to dispense substances improving the shaving performance or providing skin care.

The exemplary electric device includes a housing 1 comprising a first housing part 2 and a second housing part 3 and a seam 4 between the two housing parts 2, 3. An electric circuit is located inside the housing 1. The electric circuit includes a printed circuit board 5, wires 6 connecting the printed circuit board 5 to pins 7 of the power plug and wires 8 of a cable 9 for connecting the power plug to the device whereto power is to be applied. The printed circuit board 5 can, for instance, form a converter, for example for converting 230 V AC into 9V DC. However, the electric circuit may also be formed, for example, by a simple pair of conductors for leading current through the power plug. Electric circuits of apparatus to be used in humid circumstances need protection from humidity to avoid damage to the circuit and to avoid exposure of the user to voltage from the circuit inside the apparatus. Accordingly, to allow use of such a power plug in humid circumstances, the water resistance of the housing must satisfy quite strict requirements.

For sealing the seam 4, the housing 1 is also provided with a molded, third housing part 10 providing watertight and preferably hermetical sealing of the seam 4. The third housing part 10 is formed by a first molding 11 and a second molding 12. Apart from the seam 4, the third housing part 10 also covers surface portions 13, 14 of the first housing part 2 and of the second housing part 3 next to the seam 4. Since the third housing part 10 covers surface portions 13, 14 of the first and second parts 2, 3, it accommodates variations the flushness between the surface portions 13, 14 due to manufacturing tolerances. To achieve this effect, it is also possible to arrange that the molded third part 10 sealing the seal 4 covers a surface portion 13, 14 next to the seam 4 of the first or the second housing part 2, 3 only.

The fact that the third housing part 10 consists of more than one molding 11, 12 is advantageous, because it allows the third housing part 10 to be molded stepwise with relatively short flow paths and while feeding material via sections of the mold which do not form surface portions of the product which will be prominently visible.

Furthermore, the moldings 11, 12 of the third housing part adhere to each other along a seam which further reduces the risk of portions of the third housing part peeling off from the first and/or second housing parts 2, 3 and also reduces the risk of leakage between the third housing part 10 and the first and second housing parts 2, 3. Along the seam, the molding 12 which is molded first projects slightly further from the first and second housing parts 2, 3 than the molding 11 which is molded last. This is to reduce the risk that, during molding, material of the last molding 11 incidentally passes beyond the end of the molding 12, which would make the appearance of the seam untidy and unattractive.

The manufacture of the proposed device is preferably started by providing the first and second housing parts 2, 3, for instance, by molding the first housing part 2 to a connecting pin molding which has been molded to the connecting pins 7. The second molding 12 of the third housing part 10 is preferably molded to the second housing part 3 in the same mold in which the second housing part 3 is molded. Subsequently, the circuit board 5 and an end of the cable 9 are mounted to one of the first and second housing parts 2, 3 and the first and second housing parts 2, 3 are mounted against each other, such that a seam 4 between the first and second housing parts 2, 3 is formed and snap notches 22 engage recesses 23. Next, the assembly thus obtained is positioned in a mold in which the remainder of the third housing part 10 covering the seal 4 is molded to the two housing parts 2, 3.

In order to provide a particularly reliable sealing of the seam 4, the third housing part 10 preferably adheres to at least one of the two housing parts 2, 3. Another advantage of adherence between the third housing part 10 and each of the first and second housing parts 2, 3 covered thereby is that no mechanical anchoring is required to retain the third housing part 10 in position against the surfaces 13, 14 of the first and second housing parts 2, 3. This simplifies the construction and avoids the need for an opening in the first and second housing parts. Furthermore, this adherence allows a particularly large freedom of design of the housing of the power plug, in particular if the moldings 11, 12 of the third housing part 10 are of a color and/or texture other than that of the first and second housing parts 2, 3. If the third housing part 10 includes transparent portions, it is also advantageous if it is retained in place by adherence, because mechanical anchoring would then be visible from the outside and disturb the appearance of the housing 1.

The adherence between on the one hand the first and second housing parts 2, 3 and, on the other hand, the third housing part 10 can be achieved by way of an adhesive. However, for the sake of manufacturing efficiency and reliability of the adherence it is preferred that the adherence is obtained by direct adherence of the material of the third housing part 10 to the material or the materials of one and preferably both of the other two housing parts 2, 3.

Preferably, such adherence is at least about as strong as the weakest of the materials of the third and the first and/or second housing parts; however, an adherence having a pulling strength of at least 15% and preferably at least 30% or 45% of the pulling strength of the weakest interconnected materials is also advantageous.

Especially if the materials of which the housing parts 2, 3, 10 are molded are thermoplastic elastomers, the melting point of the third housing part 10 which is molded to the first and second housing parts 2, 3 is preferably lower than the melting points of the material of which at least one of the other two housing parts 2, 3 is molded. This ensures that, when the third housing part 10 is molded to the other two housing parts 2, 3, the first and second housing parts 2, 3 remain intact.

The material of which the third housing part 10 is molded is preferably softer than the material of which at least one of the first or second housing parts 2, 3 is molded. Thus, the first and/or second housing parts 2, 3 provide the structural rigidity of the housing while the third housing part 10 forms a padding of the housing 1 which absorbs energy if the device falls onto a hard surface, thus reducing the risk of damage to the housing 1 or to the internal parts 5 in the housing. The material of the first and second parts 2, 3 of the housing can, for instance, be a hard polyurethane whereas the material of the third housing part 10 can, for instance, be a soft polyurethane.

Since, the third housing part 10 is of a relatively soft material in the present example, for reducing the risk of damage to the device upon impact on a hard surface, it is furthermore advantageous that the third housing part 10 covers convex surface portion 13, 14 of the other two housing parts 2, 3. This increases the likelihood that should the device hit a surface, the third housing part 10 is the portion of the housing 1 that hits that surface first and absorbs the impact.

To further increase this likelihood and to specifically protect stiff and hence vulnerable housing portions, the third housing part 10 also covers convex surface portion 15–18 of the other two housing parts 2, 3 which have a smaller radius of curvature than neighboring surface portions of those two housing portions 2, 3. Such areas generally form most exposed housing portions like edges and corners.

The third housing part 10 also protects the device from damage by reducing the likelihood that the device slides off a surface or out of the hand of the user. To this end, the material of which the third housing part 10 is molded has a higher coefficient of friction than the material of which one or both of the other two housing parts 2, 3 is formed.

For counteracting sliding of the housing 1 over a flat surface by having high friction 10 relative to that flat surface, it is also advantageous that the third housing part 10 forms at least a surface portion of the housing 1 on which the housing can be placed in a stable position on a flat surface.

The third housing part 10 extends from the seam 4 to portions 19–21 of the other two housing parts 2, 3 which project past the third part 10. Thus, the edges of the third housing part 10 facing away from the seam 4 abut against portions 19–21 of the first and second housing parts 2, 3. This facilitates the formation of a smooth, well-controlled shape of the edges of the third housing part 10 facing away from the seam 4. Ensuring such smooth edges of the third housing part 10 along a continuous surface would require high compression forces between the mold and that surface. Such compression forces are difficult to realize, because the housing 1 is a relatively thin walled hollow object. Furthermore, the housing portions 19–21 protect the edges of the third housing part 10 from peeling.

The projecting portions 19–21 of the two housing parts 2, 3 project through openings in the third housing part 10 in opposite directions. This is advantageous for accurately positioning the first and second housing parts 2, 3 in the mold before the third housing part 10 is molded to the first and second housing parts 2, 3. The portions of the housing parts 2, 3 which project through openings in the third housing part 10 are also particularly suitable for carrying markings which may be printed and/or molded, because the relatively hard materials of the first and second housing parts 2, 3 are more suitable for the formation therein of fine patterns and for durably maintaining such patterns; moreover, printings generally wear off less easily from hard materials than from soft materials.

The contact pins 7 to which the electric circuit 5–8 is connected project from the housing 1 and proximal portions of the contact pins 7 are molded in a connecting pin base molding, which in turn is molded in one of the two housing parts 2, 3. Molding in the contact pins 7 directly or indirectly provides a very stable fixation of the contact pins 7 and a particularly reliable protection against leaking along the contact pin 7.

The electric cable 9 extends from inside the housing 1 to outside the housing 1. The third housing part 10 forms a sealing around a portion of the cable 9 and thereby effectively prevents leakage along the cable 9. The seal to the cable 9 is particularly effective if the material of the third housing part 10 adheres to the sheath material of the cable 9 in contact therewith as well. To this end, materials and melting points of the cable are preferably selected in conformity with the considerations set forth above with respect to the materials of the first and second housing parts 2, 3 in relation to the material of the third housing part 10.

It is to be noted that within the scope of the present invention many variations other than the above-described example are conceivable. For instance, the two housing parts need not be completely separate parts. The two housing parts can, for instance, be formed or molded integrally as a single object, the two housing parts being interconnected by easily bendable portions forming hinges which allow the two housing parts to be hinged towards the final configuration more or less enclosing the electric circuit. Furthermore, the number of housing parts to which the housing part sealing the seam and covering adjacent surface portions of one or more of the other housing parts is connected can be larger than two.

Having described a preferred embodiment of the invention, the following is claimed:

1. An electric device comprising:
   a housing comprising at least two housing parts and a seam between said first two housing parts;
   an electric circuit inside said housing,
   said housing also comprising at least one molded, third housing part sealing said seam, wherein said third housing part is comprised of a first and second molding which adhere to each other outside said seam and covers at least a surface portion of at least one of said first two housing parts adjacent said seam.

2. The device according to claim 1, wherein said third housing part adheres to said at least one of said first two housing parts.

3. The device according to claim 2, wherein said third housing part is molded of a material which adheres to the material of which said at least one of said first two housing parts is formed.

4. The device according to claim 3, wherein said material of which said third housing part is molded is a thermoplastic elastomer.

5. The device according to claim 3, wherein said material of which said third housing part is molded is a thermoplastic elastomer having a melting point lower than the melting points of the material or materials of which at least one of said first two housing parts is molded.

6. The device according to claim 1, wherein the material of which said third housing part is molded is softer than the material of which said at least one of said first two housing parts is molded.

7. The device according to claim 6, wherein said third housing part covers a convex surface portion of said at least one of said first two housing parts.

8. The device according to claim 6, wherein said third housing part covers a convex surface portion of said at least one of said first two housing parts which has a smaller radius of curvature than neighboring surface portions.

9. The device according to claim 1, wherein the material of which said third housing part is molded has a higher coefficient of friction than the material of which said at least one of said first two housing parts is formed.

10. The device according to claim 9, wherein said third housing part forms at least a surface portion of said housing on which said housing can be placed in a stable position on a flat surface and has a higher coefficient of friction relative to hard smooth surfaces than the material of which said at least one of said first two housing parts is formed.

11. The device according to claim 1, wherein said third housing part extends from said seam to a portion of said at least one of said first two housing parts which projects past said third housing part.

12. The device according to claim 11, wherein said projecting portions of said at least one of said first two housing parts projects through openings in said third housing part in opposite directions.

13. The device according to claim 1, wherein said electric circuit is connected to contact pins, said contact pins projecting from said housing and proximal portions of said contact pins being molded in at least one of said first two housing parts.

14. The device according to claim 1, also including an electric cable extending from inside said housing to outside said housing, said third housing part forming a seal around a portion of said cable.

* * * * *